US011121490B1

(12) United States Patent
Fu et al.

(10) Patent No.: US 11,121,490 B1
(45) Date of Patent: Sep. 14, 2021

(54) CIRCUIT BOARD FIXING STRUCTURE

(71) Applicants: Inventec (Pudong) Technology Corporation, Shanghai (CN); INVENTEC CORPORATION, Taipei (TW)

(72) Inventors: Yung-Teng Fu, Taipei (TW); Kuo-En Chang, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/891,090

(22) Filed: Jun. 3, 2020

(30) Foreign Application Priority Data

Mar. 10, 2020 (CN) .......................... 202010163158.6

(51) Int. Cl.
*H01R 12/71* (2011.01)

(52) U.S. Cl.
CPC .................... *H01R 12/71* (2013.01)

(58) Field of Classification Search
CPC ........ H01R 12/71; H01R 9/16; H01R 9/0515; H01R 12/00; H01R 12/50; H01R 12/51; H01R 12/52; H01R 12/59; H01R 12/523
USPC ............................................. 439/78
See application file for complete search history.

(56) References Cited

U.S. PATENT DOCUMENTS

| 4,911,417 | A | * | 3/1990 | Short | B60G 7/00 |
| | | | | | 267/256 |
| 5,141,357 | A | * | 8/1992 | Sherman | F16B 5/025 |
| | | | | | 403/4 |
| 6,270,355 | B1 | * | 8/2001 | Kihara | H01R 33/09 |
| | | | | | 439/56 |
| 6,773,269 | B1 | * | 8/2004 | Downes | H05K 3/368 |
| | | | | | 439/55 |
| 6,818,839 | B2 | * | 11/2004 | Hosaka | H01R 12/57 |
| | | | | | 174/262 |
| 6,821,133 | B1 | * | 11/2004 | Latal | H01R 13/745 |
| | | | | | 439/92 |
| 7,322,828 | B1 | * | 1/2008 | Chiang | H01R 13/7175 |
| | | | | | 439/419 |
| 7,892,022 | B2 | * | 2/2011 | Mostoller | F21V 19/0055 |
| | | | | | 439/507 |
| 8,337,132 | B2 | * | 12/2012 | Steffenfauseweh | F16B 5/0225 |
| | | | | | 411/539 |
| 8,716,616 | B2 | * | 5/2014 | Forsberg | H01H 9/0207 |
| | | | | | 200/293 |
| 9,065,187 | B2 | * | 6/2015 | Leshniak | H01K 5/00 |
| 2006/0088389 | A1 | * | 4/2006 | Meernik | E04H 15/56 |
| | | | | | 405/302.7 |
| 2011/0073891 | A1 | * | 3/2011 | Yen | H01L 33/642 |
| | | | | | 257/98 |
| 2014/0179139 | A1 | * | 6/2014 | Tanaka | F21V 19/003 |
| | | | | | 439/226 |

* cited by examiner

*Primary Examiner* — Harshad G Patel
(74) *Attorney, Agent, or Firm* — CKC & Partners Co., LLC (57) ABSTRACT

A circuit board fixing structure comprising a first fixing element and a first circuit board is provided. The first fixing element includes a shaft, a first flange and a second flange. One end of the shaft is provided with a receiving portion. The first flange is connected with a side surface of the shaft. The second flange is connected with the side surface of the shaft and is spaced apart from the first flange. The first circuit board is fixed on a surface of the first flange away from the second flange.

13 Claims, 7 Drawing Sheets

CIRCUIT BOARD FIXING STRUCTURE

RELATED APPLICATIONS

This application claims priority to China Application Serial Number 202010163158.6, filed Mar. 10, 2020, which is herein incorporated by reference.

BACKGROUND

Field of Invention

The present disclosure relates to a circuit board fixing structure.

Description of Related Art

The statements in this section merely provide background information related to the present disclosure and do not necessarily constitute prior art.

Traditional ways of fixing a circuit board fixing element with screw holes thereon (i.e., a standoff) to a circuit board is to directly set the circuit board fixing element with screw holes thereon on an upper surface of the circuit board, so as to facilitate the screw holes to perform further combinations with other circuit boards, plates, or chassis. Other ways of fixing are to use a fixing element without screw holes thereon, such as a spool. For example, using two parallel flanges of the fixing element to clamp the circuit board, and then a shaft of the fixing element and a metal chassis are combined by stamping and riveting. When adjacent two circuit boards are fixed together, one of the circuit boards usually has a gourd-shaped hole to facilitate installation and disassembling of the circuit boards. Generally, opening portions of the gourd-shaped hole cannot be provided with circuits or parts. The ways of fixing as mentioned inevitably reduce space for circuit layout on the circuit board.

SUMMARY

With the progress of science and technology in recent years, demands for high system integration, multiplexing, and high-speed signals have increased the circuit wiring density. Layout spaces of circuit boards and components have a great influence on signal quality and product cost. In view of this, one purpose of the present disclosure is to propose structures which can reduce the space occupied by the fixing structure on the circuit board and possess a more flexible installation requirement, so as to further enhance space utilization rate of the circuit board. The circuit layout and positions for the placement of parts may be more flexible so as to meet requirements of layouts for circuits and components.

An object of the present disclosure is to provide a first fixing element on a first circuit board to support a first circuit board and is able to receive another structural element (e.g., a circuit board) at a top end of the first fixing element. The first circuit board is prevented from being deformed or damaged when disassembling the received object on the top end.

Another object of the present disclosure is that a bottom of the first fixing element as provided may be fixed on the second fixing element, and is used to support a portion of the first circuit board.

Still another object of the present disclosure is to provide a quick-release structure formed by the first flange and the second flange of the first fixing element in cooperative with a recessed portion of a chassis.

Still another object of the present disclosure is that the top end of the first fixing element has a screw hole structure, which can be configured to receive and fix the structural element (e.g., the circuit board).

According to some embodiments of the present disclosure, a circuit board fixing structure is provided. The circuit board fixing structure includes a first fixing element and a first circuit board. The first fixing element includes a shaft, a first flange and a second flange. one end of the shaft is provided with a receiving portion. The first flange is connected with a side surface of the shaft. The second flange is connected with the side surface of the shaft and is spaced apart from the first flange. The first circuit board fixed on a surface of the first flange away from the second flange.

In one or more embodiments of the present disclosure, the circuit board fixing structure further includes a second fixing element partially clamped between the first flange and the second flange. The second flange is at another end of the shaft, and the another end is opposite to the end provided with the receiving portion.

In one or more embodiments of the present disclosure, the second fixing element is a chassis.

In one or more embodiments of the present disclosure, the chassis has a through hole. A portion of the shaft between the first flange and the second flange passes through the through hole, and the first flange and the second flange abut against two opposite surfaces of the chassis, respectively.

In one or more embodiments of the present disclosure, the first flange abuts against the chassis or the second flange abuts the chassis.

In one or more embodiments of the present disclosure, the chassis includes a base portion and a recessed portion connected with each other. The through hole extends at least to the recessed portion, and the second flange is in the recessed portion.

In one or more embodiments of the present disclosure, the chassis has a through hole. A portion of the shaft between the first flange and the second flange passes through the through hole, and the first flange abuts the shaft or the second flange abuts the shaft.

In one or more embodiments of the present disclosure, the end of the shaft provided with a screw hole penetrates out of a surface of the first circuit board facing away from the chassis.

In one or more embodiments of the present disclosure, the second fixing element is a clamping element. The clamping element clamps the second flange, or the first flange and the second flange clamp the clamping element. The clamping element has a groove portion, and a portion between the first flange and the second flange is clamped at an upper edge of the groove portion of the clamping element.

In one or more embodiments of the present disclosure, the first circuit board and the first fixing element form a surface mounted structure.

In one or more embodiments of the present disclosure, a height of the second flange relative to the side surface of the shaft is greater than a height of the first flange relative to the side surface of the shaft.

In one or more embodiments of the present disclosure, an outer edge of the second flange is directional.

In one or more embodiments of the present disclosure, the circuit board fixing structure further includes a structural element on the receiving portion.

In one or more embodiments of the present disclosure, the receiving portion is a screw hole extending into the shaft.

In one or more embodiments of the present disclosure, the structural element is a second circuit board, and the second circuit board is fixed to the screw hole.

The embodiments of the present disclosure as mentioned at least reduce opening areas required by the first circuit board and increase space for layout and setting parts on the first circuit board by fixing the first circuit board on a surface of the first flange away from the second flange.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

In various embodiments, the description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. Reference throughout this specification to "one embodiment," "an embodiment" or the like means that a particular feature, structure, configuration, or characteristic described in connection with the embodiment is included in at least one embodiment of the disclosure. Thus, the appearances of the phrase "in one embodiment," "in an embodiment" or the like in various places throughout this specification are not necessarily referring to the same embodiment of the disclosure. Furthermore, the particular features, structures, configurations, or characteristics may be combined in any suitable manner in one or more embodiments.

Figure 1A:
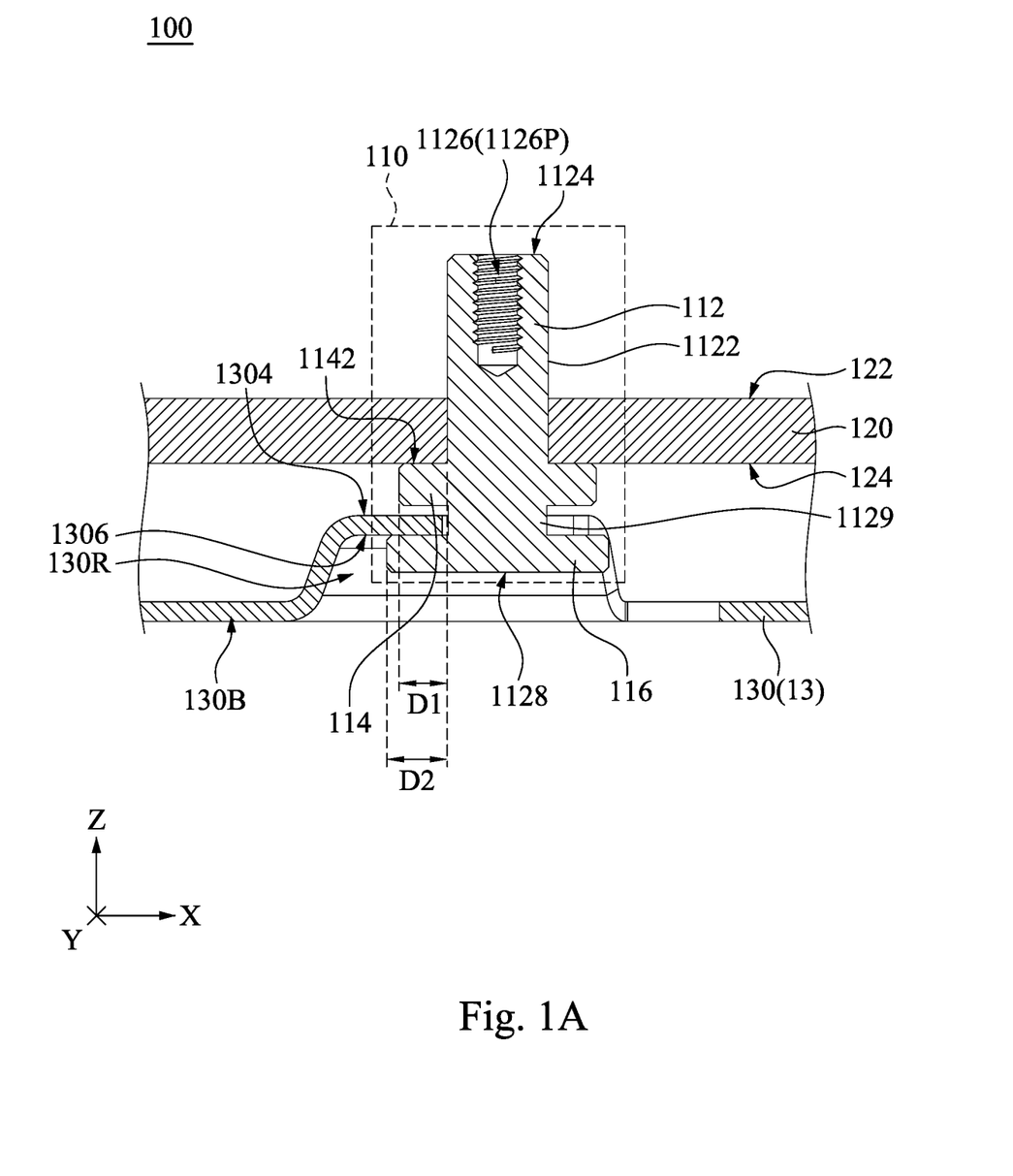
FIG. 1A is a side cross-sectional view of a circuit board fixing structure according to some embodiments of the present disclosure.

Reference is made to FIG. 1A. FIG. 1A is a side cross-sectional view of a circuit board fixing structure 100 according to some embodiments of the present disclosure. The circuit board fixing structure 100 includes a first fixing element 110 and a first circuit board 120. The first circuit board 120 may be a computer motherboard (a motherboard in a server), a smaller adapter card with a specific function, or a solid-state hard disk, etc., but should not be limited thereto. In some embodiments, the circuit board fixing structure 100 also includes a second fixing element 13. One exemplified type of the second fixing element 13 in the present disclosure is a chassis 130, and another exemplified type will be mentioned at the end of the detailed description. The chassis 130 may be a metal element (e.g., an iron element) or a plastic element, but should not be limited thereto. The first fixing element 110 includes a shaft 112, a first flange 114, and a second flange 116. The first flange 114 is connected with a side surface 1122 of the shaft 112. The second flange 116 is connected with the side surface 1122 of the shaft 112 and is spaced apart from the first flange 114. In some embodiments, the first flange 114 and the second flange 116 are annularly provided on the side surface 1122 of the shaft 112. The first flange 114 and the second flange 116 are penetrated by the shaft 112. The first flange 114 and the second flange 116 are in contact with the side surface 1122 of the shaft 112. The first fixing element 110 may be made of metal, such as aluminum or carbon steel, but should not be limited thereto. The first fixing element 110 may be formed as a single piece, but should not be limited thereto. The first circuit board 120 is fixed on a surface 1142 of the first flange 114 away from the second flange 116. In some embodiments, the first circuit board 120 and the first fixing element 110 form a surface mounted structure by a surface-mount technology (SMT). After the first circuit board 120 and the first fixing element 110 form a surface mounted structure with each other, the chassis 130 is partially clamped between the first flange 114 and the second flange 116. In some embodiments, the shaft 112, the first flange 114, and the second flange 116 are formed as a single piece.

Figure 1B:
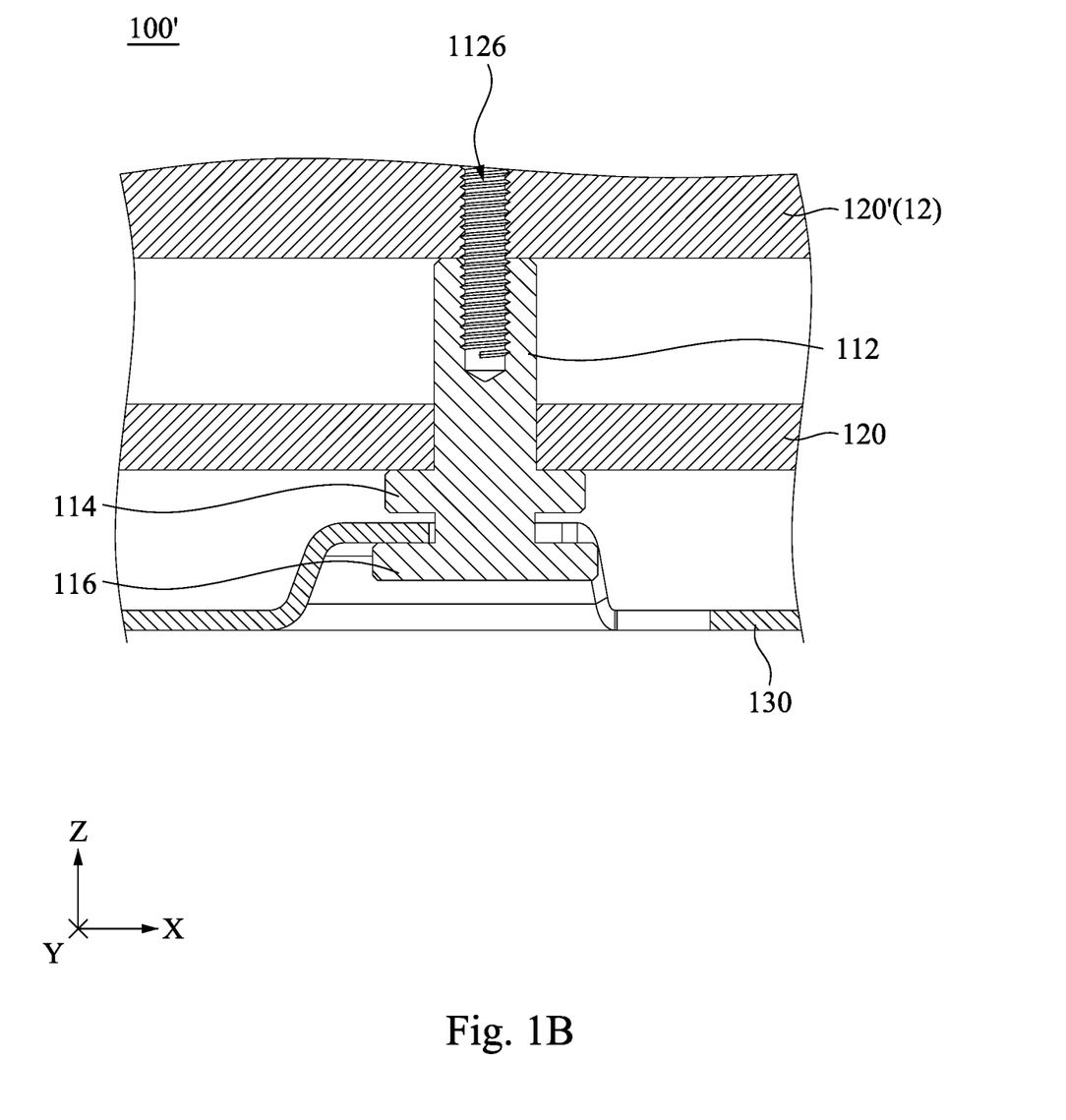
FIG. 1B is a side cross-sectional view of a circuit board fixing structure according to some embodiments of the present disclosure.

Reference is made to both FIG. 1A and FIG. 1B. FIG. 1B is a side cross-sectional view of a circuit board fixing structure 100' according to some embodiments of the present disclosure. A difference between embodiments as illustrated by FIG. 1B and the embodiments as illustrated by FIG. 1A is that, FIG. 1B shows a structural element 12 (e.g., a second circuit board 120', but should not be limited thereto) fixed to the first fixing element 110. In some embodiments, one end 1124 of the shaft 112 is provided with a receiving portion 1126P, and the structural element 12 may be disposed on the receiving portion 1126P. The receiving portion 1126P may be a screw hole 1126 or even a hook or the like, but should not be limited thereto. In some embodiments, the screw hole 1126 extends in a direction from said end 1124 to the first flange 114 and the second flange 116 (e.g., negative Z direction as shown in FIGS. 1A and 1B) and into the shaft 112. The screw holes 1126 may be configured to fix the second circuit board 120' or other components according to user needs to the circuit board fixing structure 100 by screws. The screws in the screw holes 1126 shown in FIGS. 1A and 1B are only schematic diagrams, which indicate that the screw holes 1126 can accommodate screws for fixing. In some embodiment, the second flange 116 is at another end 1128 of the shaft 112 opposite to the end 1124 where the screw hole 1126 is provided. In some embodiments, said end 1124 of the shaft 112 penetrates out of a surface 122 of the first circuit board 120 facing away from the chassis 130. In addition, since the screw hole 1126 is provided on the shaft 112 of the first fixing element 110, there is a benefit of supporting when the screw is fixed compared to conventional ways of providing screw holes on the first circuit board 120. In addition, damage on the first circuit board 120 or parts due to actions of screw-in can be avoided. Furthermore, in such embodiments, the first circuit board 120 can be fixed to the chassis 130 by only a single first fixing element 110. The second circuit board 120' fixed by screws is also allowed to be added above the first circuit board 120 by using the same first fixing element 110. A considerable amount of holes on the first circuit board 120 can thus be omitted. Therefore, under the trend nowadays that requires wiring density and utilization of space for parts of the first circuit board 120, the embodiments as mentioned are conduced to the advancement of this trend.

Figure 2:
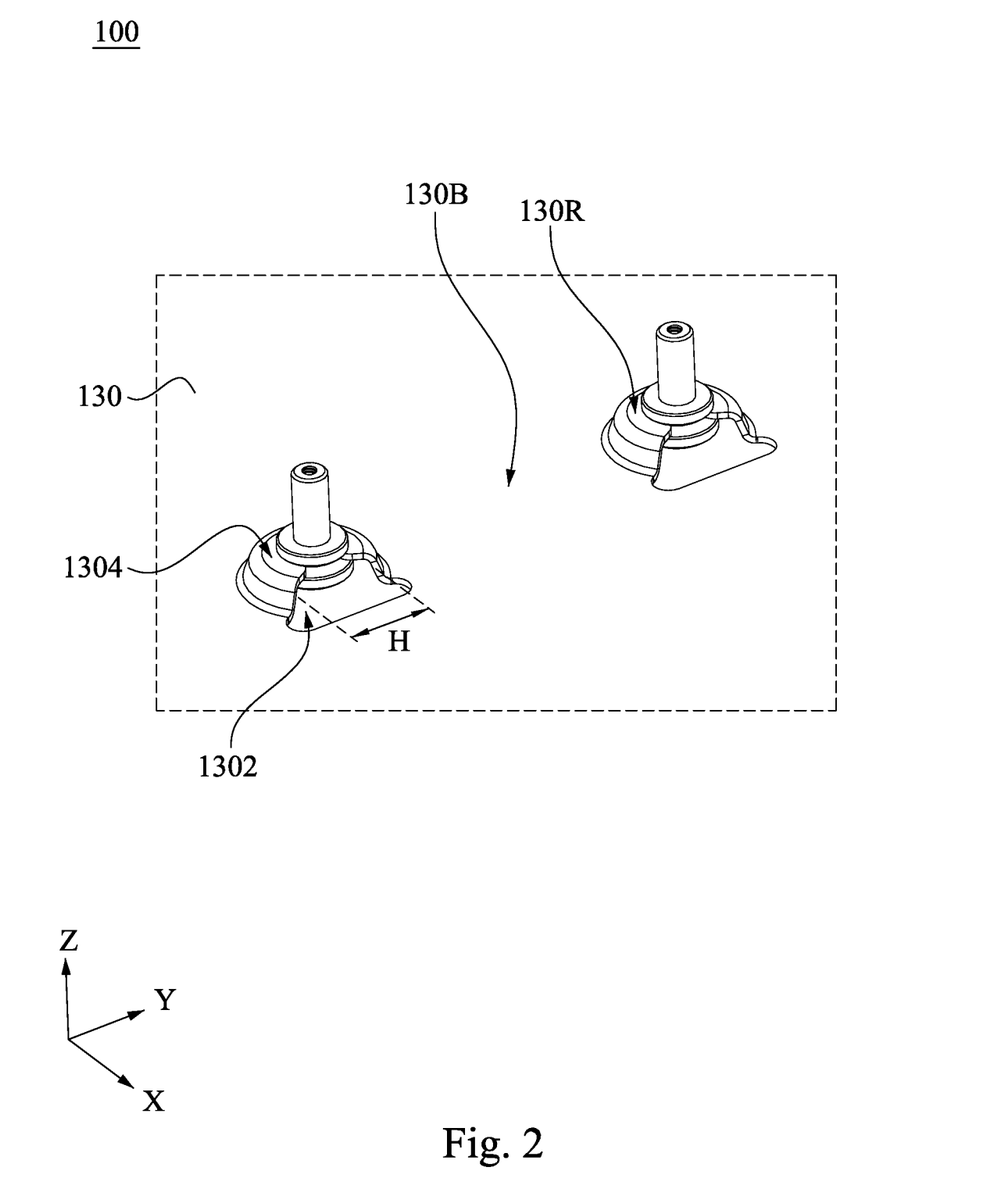
FIG. 2 is a perspective view of a circuit board fixing structure according to some embodiments of the present disclosure.

Reference is made to both FIG. 1A and FIG. 2. FIG. 2 is a perspective view of the circuit board fixing structure 100 according to some embodiments of the present disclosure. FIG. 2 selectively not to show the first circuit board 120 in order to clearly illustrate a structural relationship between the chassis 130 and the first fixing element 110. In some embodiments, the chassis 130 has a through hole 1302. With the through hole 1302, a portion of the chassis 130 is detachably fixed between the first flange 114 and the second flange 116, and a portion 1129 of the shaft 112 between the first flange 114 and the second flange 116 passes through the through hole 1302. In some embodiments, the first flange 114 and the second flange 116 abut against two opposite surfaces 1304, 1306 of the chassis 130, respectively. In some embodiments, only the first flange 114 abuts against the surface 1304 of the chassis 130. In some embodiments, only the second flange 116 abuts against the surface 1306 of the chassis 130. In some embodiments, the portion 1129 of the shaft 112 between the first flange 114 and the second flange 116 abuts against the chassis 130. Since in the above embodiments, the portion 1129 of the shaft 112 between the first flange 114 and the second flange 116 is cooperative with the first flange 114 and the second flange 116 so as to clamp the chassis 130, and the first circuit board 120 is fixed on the surface 1142 of the first flange 114 away from the second flange 116, the embodiments of the present disclosure can free up more space on the first circuit board 120 for wiring and setting parts. The setting of larger area holes on the first circuit board 120 can be omitted, thereby optimizing space utilization of the first circuit board 120. The larger area holes (e.g., gourd-shaped holes, but should not be limited thereto) are set on the chassis 130 instead.

Reference is still made to FIG. 2. In some embodiments, the chassis 130 includes a base portion 130B and a recessed portion 130R connected with each other. The through hole 1302 extends at least to the recessed portion 130R, and the second flange 116 is in the recessed portion 130R. The recessed portion 130R is able to accommodate the second flange 116 of the first fixing element 110 that clamps the chassis 130. Since a recessed direction of the recessed portion 130R is toward the first circuit board 120 (e.g., Z direction as shown in FIGS. 1A, 1B, and 2), and the second flange 116 is accommodated in the recessed portion 130R, a surface of the chassis 130 facing away from the first circuit board 120 is relatively flush as a whole. There is no appearance of protrusion of the second flange 116 (in negative Z direction) relative to the chassis 130.

Figure 3:
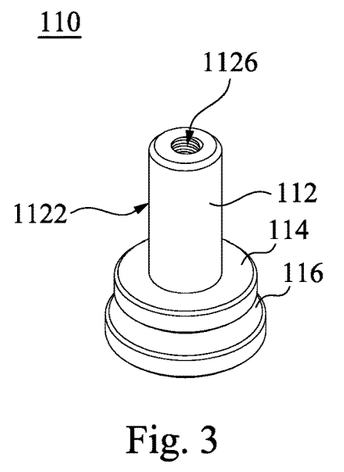
FIG. 3 is a schematic stereogram of a first fixing element according to some embodiments of the present disclosure.

Reference is made to FIG. 1A and FIG. 3. FIG. 3 is a schematic stereogram of the first fixing element 110 according to some embodiments of the present disclosure. The first fixing element 110 in FIG. 3 can be regarded as one example of the first fixing element 110 as shown in FIG. 1A. The shaft 112 as shown in FIG. 3 is a cylinder, and the side surface 1122 is a cylindrical surface. In some embodiments, a height D2 of the second flange 116 relative to the side surface 1122 of the shaft 112 (along an extension direction of X-Y plane) is greater than a height D1 of the first flange 114 relative to the side surface 1122 of the shaft 112. Reference may be made to labels in FIG. 1A and the first flange 114 and the second flange 116 in FIG. 3. In such embodiments, since the second flange 116 protrudes more outward than the first flange 114 relative to the shaft 112, an area where the second flange 116 able to be in contact with the chassis 130 is increased, and the clamping is thus more stable. When the first circuit board 120 is installed on the chassis 130, it becomes more stable. Meanwhile, since an extent of protrusion of the first flange 114 is less than that of the second flange 116, an influence on space of circuit layout on a surface 124 of the first circuit board 120 which contacts the first flange 114 is thus reduced. In some other embodiments, a width of the portion 1129 of the shaft 112 between the first flange 114 and the second flange 116 is greater than a width of other portions of the shaft 112. A direction of measurement of the width is the same as the extension direction of the heights D1, D2. Such embodiments can further increase the area where the second flange 116 is able to be in contact with the chassis 130 as mentioned, such that the clamping is more stable.

Figure 4:
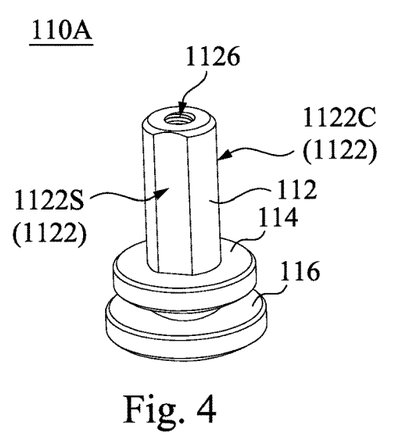
FIG. 4 is a schematic stereogram of a first fixing element according to some embodiments of the present disclosure.

Reference is made to FIG. 1A and FIG. 4. FIG. 4 is a schematic stereogram of a first fixing element 110A according to some embodiments of the present disclosure. The first fixing element 110A in FIG. 4 can be regarded as one example of the first fixing element 110 as shown in FIG. 1A. In some embodiments, the side surface 1122 of the shaft 112 has a circular arc surface 1122C and a stop surface 1122S connected with each other. The stop surface 1122S may be a flat surface. The benefit of the side surface 1122 which includes the stop surface 1122S is that in a specific application, if a force suffered by the first circuit board 120 in said application is known in advance, a planar stop surface 1122S facing a direction of the suffered force may be provided according to said direction. Generally, the planar stop surface 1122S is more capable of resisting a force normal to the planar stop surface 1122S than the arc surface or the cylindrical surface of the first fixing element 110 as shown in FIG. 3. Therefore, the first circuit board 120, peripheral parts, and the circuit layout can be further protected from damage in specific applications.

Figure 5:
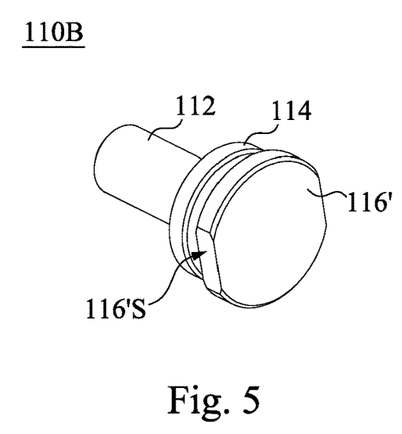
FIG. 5 is a schematic stereogram of a first fixing element according to some embodiments of the present disclosure.

Reference is made to FIG. 1A, FIG. 2, and FIG. 5. FIG. 5 is a schematic stereogram of a first fixing element 1106 according to some embodiments of the present disclosure. The first fixing element 1106 in FIG. 5 can be regarded as one example of the first fixing element 110 as shown in FIG. 1A. In some embodiments, an outer edge of the second flange 116' is directional, which can be understood as non-circular, or that a lateral length of the second flange 116' measured in different extension directions on a plate surface (e.g., X-Y plane in FIGS. 1A and 2) may be different. An angle of view as defined for said non-circular is an extension direction of the shaft 112 (i.e., Z direction in FIGS. 1A and 2). For example, as illustrated by FIG. 5, a side surface 116'S of the second flange 116' has an edge angle or is a planar surface, which makes it easier for the first fixing element 110B to be installed within a relatively dense layout of parts. In some special cases, because of the way of placement of parts, only the second flange 116' extending along a specific direction or with a specific geometry can cause the first fixing element 110B to clamp the chassis 130. Comparing to the second flange 116 (having a circular outer edge) of the first fixing element 110 as shown in FIG. 3, the non-circular second flange 116' is more flexible in applications.

Figure 6A:
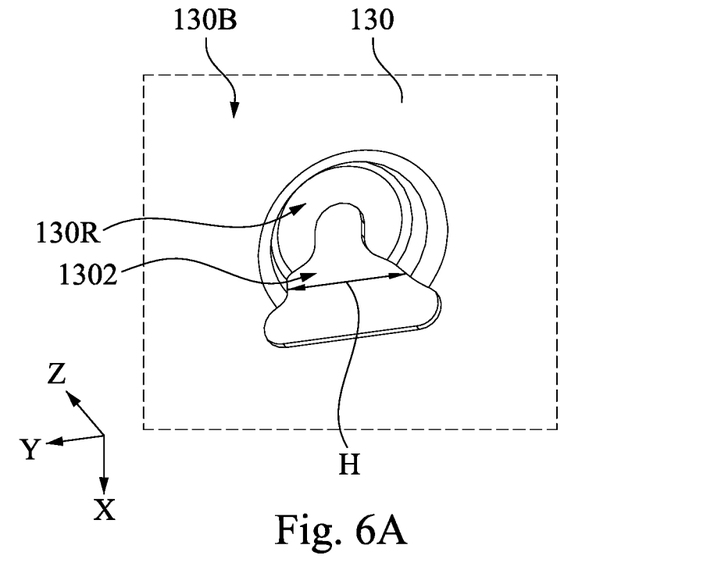
FIG. 6A illustrates one surface of a recessed portion of a chassis facing away from a first circuit board according to some embodiments of the present disclosure.
Figure 6B:
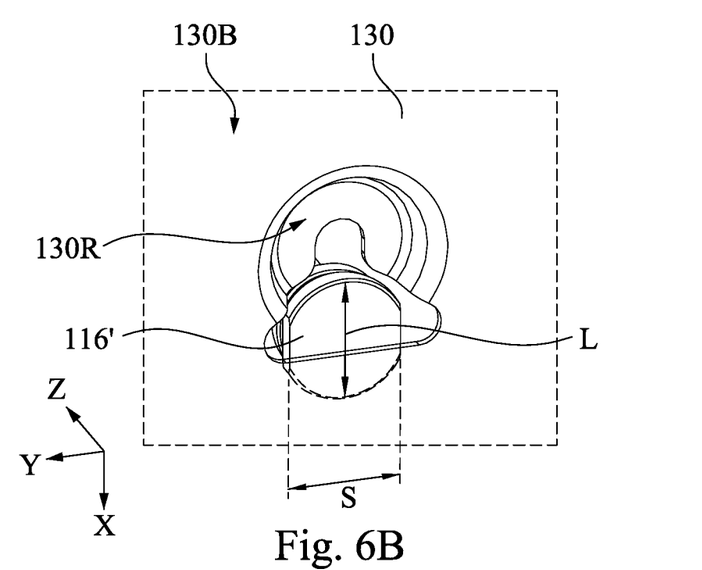
FIG. 6B is a schematic diagram of one step of installing the first fixing element to the chassis from the perspective of FIG. 6A.
Figure 6C:
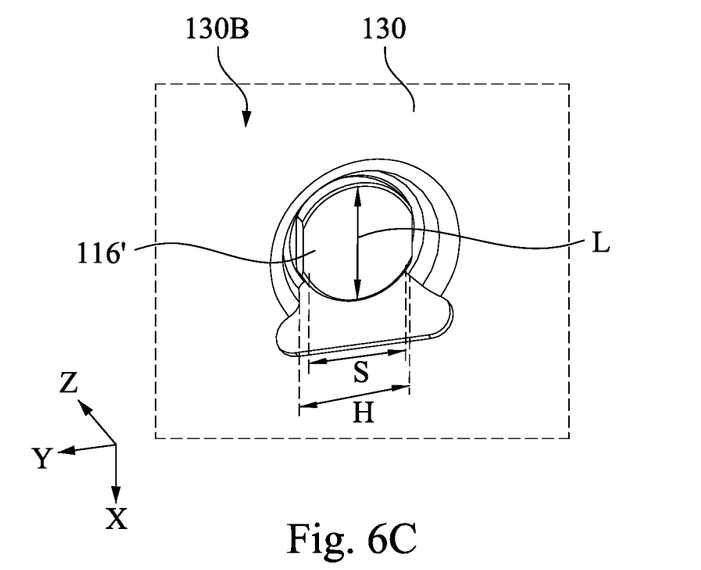
FIG. 6C is a schematic diagram of one step of installing the first fixing element to the chassis from the perspective of FIG. 6A.
Figure 6D:
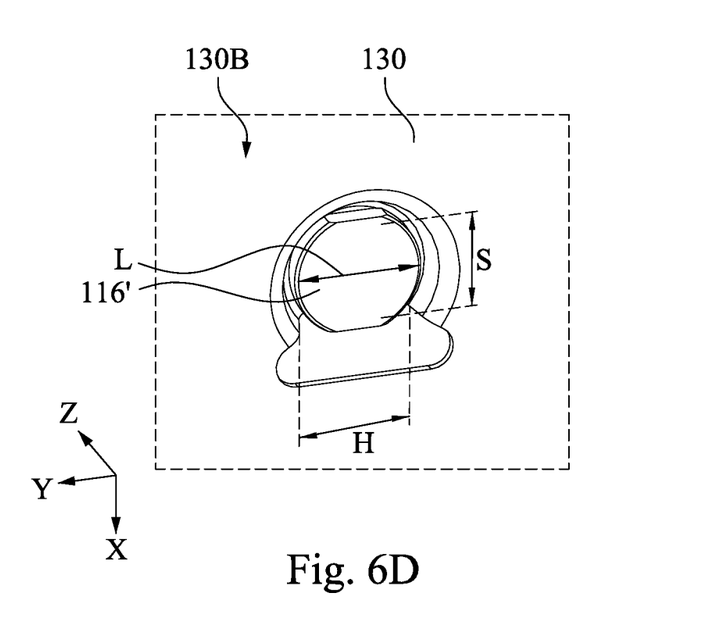
FIG. 6D is a schematic diagram of one step of installing the first fixing element to the chassis from the perspective of FIG. 6A.

Reference is made from FIG. 6A to FIG. 6D. FIG. 6A illustrates one surface of the recessed portion 130R of the chassis 130 facing away from the first circuit board 120 according to some embodiments of the present disclosure. FIG. 6B, FIG. 6C, and FIG. 6D are schematic diagrams of steps of installing the first fixing element 110B to the chassis 130 from the perspective of FIG. 6A, respectively. In some embodiments, since the second flange 116' having a non-circular outer edge as such is directional, the first circuit board 120 can be rotatably installed or disassembled in accordance with the appearance of the through hole 1302 which extends to the recessed portion 130R of the chassis 130. Taking an example of the outer edge of the second flange 116' being oval-like as shown in FIG. 6B. The oval-like shape, for instance, refers to a middle section having outer edges with straight lines together with two ends having arc outer edges, which is similar to a shape of a common playground, but should not be limited thereto. As shown in the figure, a length L of a major axis of the oval-like shape is greater than a maximum opening width H of the through hole 1302 on the recessed portion 130R, and the opening width H is greater than a length S of a minor axis of the oval-like shape. In this setting, the first fixing element 110 can be rotated at first to make an extension direction of the length L of the major axis of the second flange 116' (with the oval-like shape) face the through hole 1302, so as to pass the second flange 116' through the maximum opening width H of the through hole 1302 on the recessed portion 130R of the chassis 130 (as referred from FIG. 6B to FIG. 6C). Then, the second flange 116' is rotated by 90 degrees to a fixed position (as referred from FIG. 6C to FIG. 6D). At this moment, since the length L of the major axis of the oval-like shape is greater than the opening width H, and the extension direction of the length L of the major axis is parallel to an extension direction of the opening width H, the first fixing element 110B will not slide out of the through hole 1302 of the chassis 130 when subjected to an external force. When there is a need for disassembling the first circuit board 120, rotate the first circuit board 120 together with the first fixing element 110B by 90 degrees and withdraw the second flange 116' along the extension direction of the length L of the major axis from the recessed portion 130R of the chassis 130 via the through hole 1302 (as referred from FIG. 6D back to FIG. 6B via FIG. 6C).

Figure 7A:
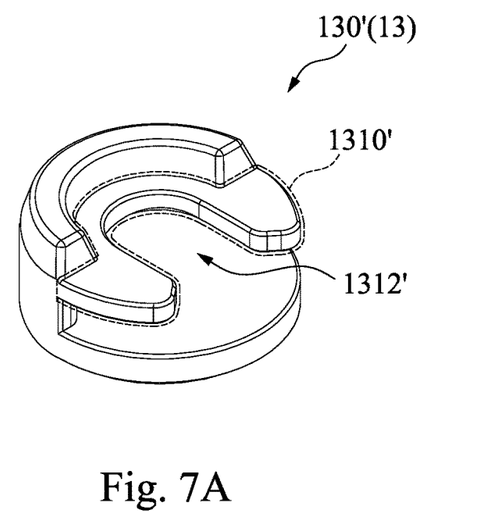
FIG. 7A is a schematic stereogram of a clamping element according to some embodiments of the present disclosure.
Figure 7B:
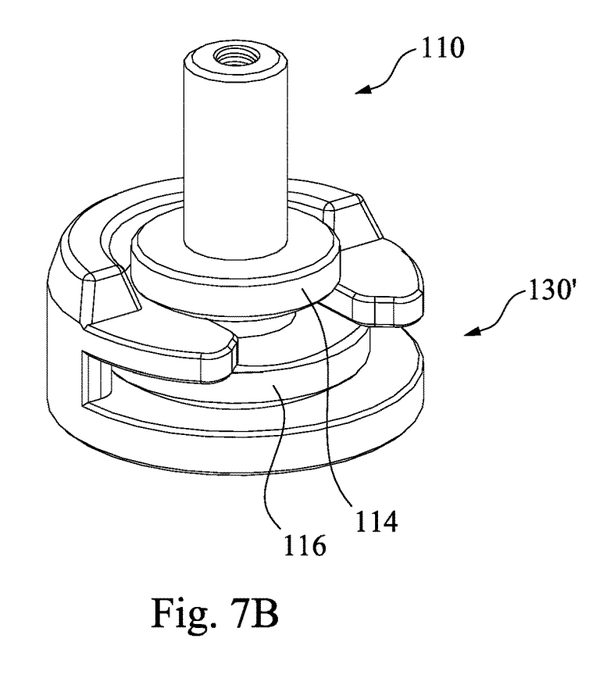
FIG. 7B is a schematic stereogram showing that the first fixing element and the clamping element are clamped with each other according to some embodiments of the present disclosure.

Reference is made to FIG. 7A and FIG. 7B. FIG. 7A is a schematic stereogram of a clamping element 130' according to some embodiments of the present disclosure. FIG. 7B is a schematic stereogram showing that the first fixing element 110 and the clamping element 130' are clamped with each other according to some embodiments of the present disclosure. Specifically, in addition to the chassis 130 as mentioned, the second fixing element 13 may also be a clamping element 130' in some embodiments. the clamping element 130' clamps the second flange 116, or the first flange 114 and the second flange 116 clamp the clamping element 130'. In some embodiments, the clamping element 130' has a clamping portion 1310' and a groove portion 1312'. An upper edge of the groove portion 1312' is defined by the clamping portion 1310', and the portion 1129 of the shaft 112 between the first flange 114 and the second flange 116 may be clamped by the groove portion 1312'. In this configuration, a surface of the clamping element 130' facing away from the first fixing element 110 can be further connected to other components, such as another chassis, another circuit board, etc., so as to expand flexibility of applications and structural variations of the circuit board fixing structure 100.

In summary, the circuit board fixing structure provided by the embodiments of the present disclosure are able to make a greatly amount of the opening be set on the chassis instead. The settings improve a deficiency of the gourd-shaped holes being formed on the circuit board in the existing technologies. The settings also improve a deficiency in which opposite surfaces of the circuit board are fixed to the first fixing element in the existing technologies which results in the sacrifice of the circuit layout and space for setting parts.

In one embodiment of the present disclosure, a server of the present disclosure may be applied to computing and edge computing of artificial intelligence (AI), and may also be used as a 5G server, a cloud server, or a server for internet of vehicles.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the method and the structure of the present disclosure without departing from the scope or spirit of the disclosure. In view of the foregoing, it is intended that the present disclosure cover modifications and variations of this disclosure provided they fall within the scope of the following claims.

What is claimed is:
1. A circuit board fixing structure, comprising:
a first fixing element, comprising:
a shaft, one end of the shaft is provided with a receiving portion;
a first flange connected with a side surface of the shaft; and
a second flange connected with the side surface of the shaft and spaced apart from the first flange;
a first circuit board fixed on a surface of the first flange away from the second flange; and
a second fixing element partially clamped between the first flange and the second flange, wherein the second flange is at another end of the shaft, and the another end is opposite to the end provided with the receiving portion.

2. The circuit board fixing structure of claim 1, wherein the first circuit board and the first fixing element form a surface mounted structure.

3. The circuit board fixing structure of claim 1, wherein a height of the second flange relative to the side surface of the shaft is greater than a height of the first flange relative to the side surface of the shaft.

4. The circuit board fixing structure of claim 1, wherein an outer edge of the second flange is directional.

5. The circuit board fixing structure of claim 1, further comprising a structural element on the receiving portion.

6. The circuit board fixing structure of claim 5, wherein the receiving portion is a screw hole extending into the shaft.

7. The circuit board fixing structure of claim 6, wherein the structural element is a second circuit board, and the second circuit board is fixed to the screw hole.

8. The circuit board fixing structure of claim 1, wherein the second fixing element is a chassis.

9. The circuit board fixing structure of claim 8, wherein the chassis has a through hole, a portion of the shaft between the first flange and the second flange passes through the through hole, and the first flange and the second flange abut against two opposite surfaces of the chassis, respectively.

10. The circuit board fixing structure of claim 9, wherein the chassis comprises a base portion and a recessed portion connected with each other, the through hole extends at least to the recessed portion, and the second flange is in the recessed portion.

11. The circuit board fixing structure of claim 8, wherein the chassis has a through hole, a portion of the shaft between the first flange and the second flange passes through the through hole, and the first flange abuts the shaft or the second flange abuts the shaft.

12. The circuit board fixing structure of claim 8, wherein the end of the shaft penetrates out of a surface of the first circuit board facing away from the chassis.

13. The circuit board fixing structure of claim 1, wherein the second fixing element is a clamping element, wherein the clamping element clamps the second flange, or the first flange and the second flange clamp the clamping element, the clamping element has a groove portion, and a portion between the first flange and the second flange is clamped at an upper edge of the groove portion of the clamping element.

* * * * *